United States Patent [19]

Blumberg et al.

[11] 4,039,867
[45] Aug. 2, 1977

[54] CURRENT SWITCH CIRCUIT HAVING AN ACTIVE LOAD

[75] Inventors: Richard Jay Blumberg, Poughkeepsie; Jack Arthur Dorler, Wappingers Falls, both of N.Y.

[73] Assignee: IBM Corporation, Armonk, N.Y.

[21] Appl. No.: 699,740

[22] Filed: June 24, 1976

[51] Int. Cl.² .................... H03K 17/60; H03K 17/04
[52] U.S. Cl. .................................. 307/255; 307/214; 307/296 A
[58] Field of Search .............. 307/214, 225, 218, 296, 307/203, 213, 270, 254, 255, 317 A, 262; 330/30 D

[56] References Cited

U.S. PATENT DOCUMENTS

| | | | |
|---|---|---|---|
| 3,261,988 | 7/1966 | Johnson | 307/214 |
| 3,416,003 | 12/1968 | Walker | 307/207 |
| 3,521,086 | 7/1970 | Slob | 307/237 |
| 3,539,824 | 11/1970 | Yu et al. | 307/218 |
| 3,573,489 | 4/1971 | Sramek | 307/215 |
| 3,610,949 | 10/1971 | Armgarth | 307/203 |
| 3,872,323 | 3/1975 | Frederiksen et al. | 307/235 R |
| 3,946,246 | 3/1976 | Marley | 307/215 X |

OTHER PUBLICATIONS

Cole et al., "Current Switch Logic Circuit," IBM Technical Disclosure Bulletin, vol. 14, No. 1, June 1971 pp. 336-337.

Blumberg et al., "Complementary Current Switch" IBM Technical Disclosure Bulletin, vol. 18, No. 5, Oct. 1975, pp. 1413-1414.

*Primary Examiner*—John Zazworsky
*Attorney, Agent, or Firm*—Thomas F. Galvin

[57] ABSTRACT

An improved current switch circuit having an active load. The active load comprises a current source at the collectors of the switch transistors which generates a current which is less than the current generated by the current source at the emitters of the switch transistors. The active load also includes both means for supplying the current difference between said source currents as supplementary current to the emitter current source when the associated switch transistors are conductive as well as means for diverting the source current at the collectors of the switch transistors when they are non-conductive.

Depending on the current generated by the current sources, the performance of the circuit can be selected to optimize power dissipation versus switching speed. The circuit utilizes a minimum number resistors, thereby using a minimum amount of semiconductor area and insuring lower power dissipation than is available with prior art circuits.

25 Claims, 4 Drawing Figures

CURRENT SWITCH CIRCUIT HAVING AN ACTIVE LOAD

BACKGROUND OF THE INVENTION

1. Field of the Invention

This invention relates to transistor switching circuits. In particular it relates to an improved switching circuit of the current switch type.

2. Description of the Prior Art

The performance of digital computers and other systems employing switching circuits are dependent upon the switching speed of the individual circuits. In general, the higher the switching speed of a circuit, the higher may be the speed of the system.

The current switch disclosed by H. S. Yourke in U.S. Pat. No. 2,964,652 is superior to all other comparable commercially-available switching circuits with respect to switching speed. It is well known, for example, that the current switch circuit is around five to ten times faster than comparable bipolar resistor-transistor-logic (RTL), diode-transistor-logic (DTL) and the transistor-transistor logic (TTL) circuit families. Moreover, it is far superior to any circuit family using field effect transistors.

In addition to high speed operation, the current switch offers excellent DC stability and good noise immunity.

For these reasons, the current switch logic family is used quite extensively in high speed digital circuitry and high performance systems requiring digital components. However, the current switch suffers from certain disadvantages as compared, say, to TTL and DTL. In particular, the power dissipated by the individual logic circuit is greater for the current switch than for the other named circuit families, primarily because one portion of the circuit or the other is always conductive. Current relates to power which must be dissipated as heat.

At the present time, in fact, the number of current switch circuits which can be "packed" on a semiconductor chip of a given size is limited only by the power dissipated within the chip. Above a certain level, around 5 watts, it is virtually impossible to dissipate sufficient heat to avoid destroying the circuits on the chip completely. At the present time the art is limited to accommodating around 600 current switch circuits on a chip around 200 mils square. It is physically possible to place more circuits on the chip from the standpoint of semiconductor area, surface wiring and input/output pads and pins. However, the circuit quantity is power-limited.

Thus, in general, it is possible to place more TTL or DTL logic circuits on a semiconductor chip than current switch circuits. For well-known reasons of reducing manufacturing costs and increasing reliability, the art is continually attempting to accommodate a maximum number of circuit components on a single semiconductor chip.

The interaction between circuit speed and power dissipation has directed the attention of circuit designers in recent years to the concept of "speed-power product", which is simply the multiplication of average circuit switching speed and the power dissipated by the circuit. For example, a circuit switching at 10 nanoseconds and dissipating 5 milliwatts of power (heat) has a speed-power product of 50 picojoules. At the present time, the speed-power product of advanced TTL circuits is practically equal to that of standard current switch circuits.

One reason for the relatively high power required by present current switching circuits is the need for load resistors through which all current flows. As a result, the resistors dissipate a good deal of heat (as well as requiring a great amount of area as compared to transistors or diodes).

SUMMARY OF THE INVENTION

It is, therefore, one object of our invention to decrease the speed-power product of current switch circuits.

It is a further object of our invention to reduce to a practical minimum the number or resistors required in a current switch circuit which is suitable for modern digital applications.

These and other objects of our invention are achieved by providing a standard current switch circuit with an active load comprising current sources at the collectors of the switch transistors which generate a current which is less than the current generated by the current sink at the emitters of the switch transistors. The active load also includes means for supplying the current difference between source and sink currents as supplementary current to the sink when the associated switch transistors are conductive and means for diverting the source current to a reference potential when the switch transistors are non-conductive.

In the preferred embodiment, each current source is a transistors having a conductivity type opposite that of the switch transistors.

DESCRIPTION OF THE PREFERRED EMBODIMENT

Figure 1:
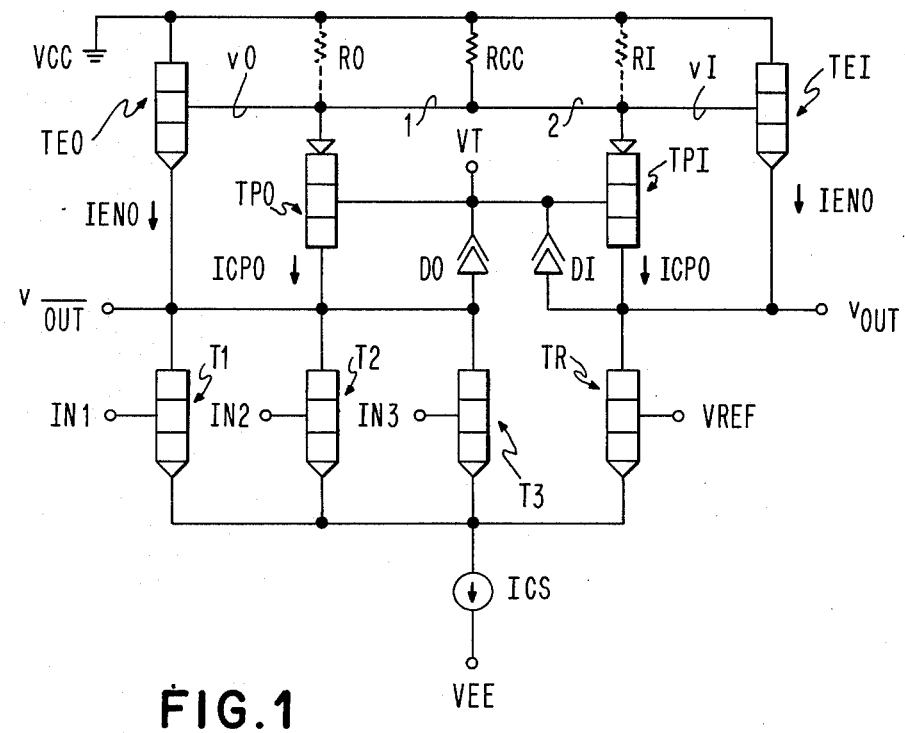
FIG. 1 is a circuit diagram of one embodiment of our invention.

Turning to FIG. 1, the current switch logic circuit comprises basically a plurality of NPN switch transistors T1, T2, T3 and TR, connected between a first reference potential, VCC, and a constant current sink denoted ICS. AS is well known, the current sink may comprise an NPN transistor having its collector connected to the emitters of the switch transistors, its base connected to a reference bias and its emitter connected to VEE through a resistor. Alternatively, the current sink may be a high value resistor.

The base of reference switch transistor TR is connected to an input reference potential, denoted VREF, which preferably has a value mid-way between the voltage values corresponding to the binary 1 and binary 0 bits of information of the logic circuit. The out-of-phase output of the circuit, $v_{\overline{out}}$, is taken from the collector of T1, T2 and T3; and the in-phase output $v_{out}$ is taken from the collector of TR.

In the preferred embodiment, VREF equals $-1.25$ volts and the logic input levels at input switch transistors T1, T2 and T3 are approximately $-1.0$V up level and $-1.5$ V down level.

The active load for input switch transistors T1, T2 and T3 comprises transistors TEO and TPO, resistor RCC, diode DO and potential VT. Transistor TPO, which is a complementary conductivity type (PNP) with respect to the switch transistors T1, T2, and T3, is connected to the collectors thereof. The emitter of TPO is connected to a source of potential VCC through resistor RCC. Resistor RCC, diode DO and potential VT set the current ICPO available through TPO to the collectors of T1, T2 and T3. Thus, TPO functions as a constant current source for its associated switch transistors. Current ICPO is always less than current ICS. Depending on the particular design characteristics desired, RCC is generally around 0.7 kilohms.

Diode DO is connected between the collector and base of TPO. The cathode of DO is connected to a reference potential VT. Diode DO and potential VT function as a path for diverting current ICPO when switch transistors T1, T2 and T3 are non-conductive. Diode DO and VT also serve to define the most positive level, i.e., the up level, at output terminal $v_{\overline{out}}$. Diode DO is advantageously a Schottky Barrier diode to assure fast switching and because it can be easily integrated with the transistors in a semiconductor chip.

In the preferred embodiment, VT equals $-1.5V$ and the forward voltage drop of DO equals 0.5 V. This sets the logic output levels at $v_{\overline{out}}$ at approximately $-1.5V$ down level and $-1.0V$ up level.

Transistor TEO is connected between VCC and the collectors of transistors T1, T2 and T3. TEO functions as a means for supplying supplementary current IENO, which is the difference between ICS and ICPO, when any one of transistors T1, T2 or T3 are conductive. Thus:

(1). ICS = ICPO + IENO

TEO also serves to define the most negative level, i.e., the down level at terminal $v_{\overline{out}}$.

The active load for switch transistor TR comprises transistors TEI and TPI, diode DI, resistor RCC and VT.

Switch transistor TR is connected to these elements in the same fashion as diode DO, transistors TPO and TEO are connected to transistors T1, T2 and T3.

Because the active loads for each side of the circuit in FIG. 1 are relatively isolated from each other, the ICPO currents from TPO and TPI need not be identical. In fact, it may be desirable to set the ICPO current through TPO greater than the ICPO current through TPI because of the greater capacitance at the collectors of T1, T2 and T3 as compared to that at the collector of TR.

In that case, resistor RCC would be removed and displaced by a pair of resistor RO and RI, between VCC and the emitters of TPO and TPI, respectively. In addition, electrical connections 1 and 2 would be deleted. Such a configuration is illustrated by means of phantom lines in FIG. 1. Typically, resistor RO would have a value somewhat less than the value of RI, e.g., RO=1.3 kilohms and RI = 1.5 kilohms.

For convenience and ease of description in the specification, we have designated ICS as a current sink and TPO as a current source in terms of positive circuit flow between the reference potentials VCC and VEE. Generally speaking, however, each is broadly denoted a current source in the art, with the significant consideration being that ICS, ICPO and IENO tend to flow in the same direction between VCC and VEE.

OPERATION ON THE CIRCUIT IN FIG. 1

Transistors TPO and TPI are always conducting current; and it is critical for the operation of our circuit that current ICPO generated from either of the transistors TPO or TPI is always less than the current ICS.

Assume that the inputs at IN1, IN2 and IN3 are all at a down level below the potential VREF at the base of TR. In this condition transistors T1, T2 and T3 are off and TR is on, conducting current ICS. Because ICS is greater than ICPO, transistor TEI starts to conduct supplementary current IENO. The output signal at inphase terminal $v_{out}$ is then equal to the output reference potential VT, i.e., $-1.5$ V down level.

The reason for this is as follows: vI equals the potential VT plus the base-emitter voltage drop ($V_{BE}$) of transistor TPI. Similary, $v_{out}$ is equal to potential vI at the base of TEI minus the $V_{BE}$ of transistor TEI when it is conducting. Because the $V_{BE}$'s of the transistors are substantially the same, the effects of the $V_{BE}$'s of TPI and TEI offset each other; and $v_{out}$ equals VT when transistor TR is conducting.

Simultaneously with the above operation and considering the output at terminal $v_{\overline{out}}$, transistor TR is conducting current ICPO. However, since transistors T1, T2 and T3 are off, all of the current ICPO from TPO flows through diode DO to terminal VT. This causes terminal $v_{\overline{out}}$ to rise to a potential above VT which is equal to the forward voltage drop ($V_f$) of diode DO. As previously noted, diode DO is advantageously a Schottky Barrier diode having a potential drop of around 0.5 V. Therefore the potential at terminal $v_{\overline{out}}$ is $-1.5V + 0.5V = -1.0V$ up level.

The operation of the circuit when either T1, T2 or T3 are turned on, as by a $-1.0V$ signal at any combination of the inputs, is similar. When either T1, T2 or T3, or any combination thereof turn on, the reference switch transistor TR turns off. Current ICPO from transistor TPO is thereby transmitted through whichever one of transistors T1, T2 or T3 is conductive. Since ICS is greater than ICPO, transistor TEO turns on. (With TR off, TEI turns off). The output potential at $v_{out}$ then falls to VT, $-1.5$ V, and the potential at $v_{\overline{out}}$ rises to $-1.0$ V.

The advantages of our circuit in FIG. 1 reside in the fact that its AC performance is proportional to the current level ICS and the Beta of the complementary transistors TPO and TPI. For example, with a Beta of 3 for the complementary transistors, ICS set to 0.75 mA and ICPO set to 0.5 mA, an average circuit delay of 0.5 nanosecond is achieveable. The power dissipation is approximately 3.0 mW, for a speed-power product of 1.5 picojoules. With higher speed, the power dissipation is greater, and is selectable over a wide range depending on the circuit designer's selection of current levels. To a first approximation the down-going transition is a function of the difference between the current levels ICS and ICPO, i.e., supplementary current IENO.

Another advantage of the circuit is that the up and down levels at the outputs are quite independent of resistor tolerance or tracking. The output level swings are a function solely of the $V_{BE}$'s of transistors TEO, TPO, TEI and TPI and the forward voltage drops of the schottky barrier diodes, DO and DI.

Moreover, the circuit requires only one or two resistors, which may be integrated within the semiconductor chip containing the circuits.

Figure 2:
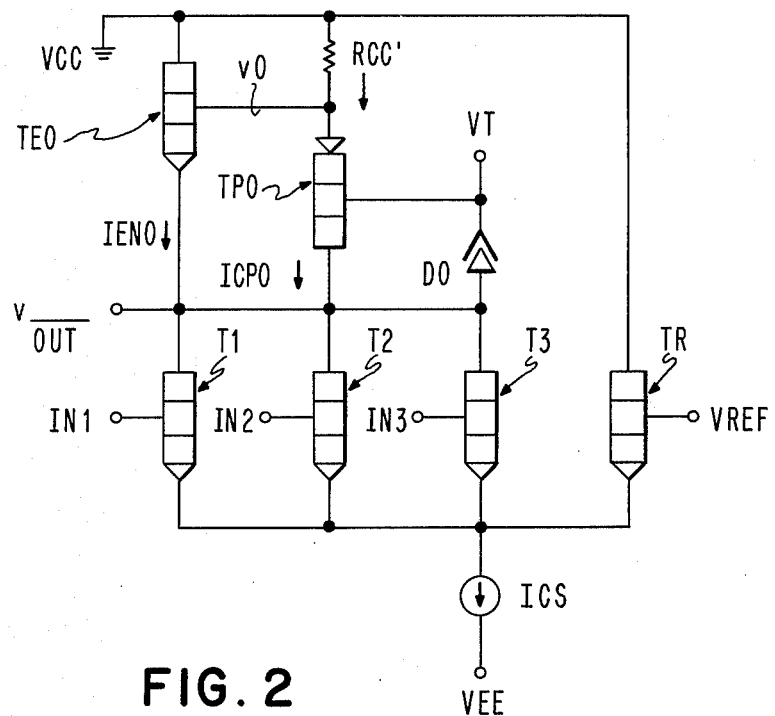
FIG. 2 illustrates a simpler version of the circuit of FIG. 1.

The circuit in FIG. 2 may be used in the event that only the out-of-phase output, $v_{\overline{out}}$, is desired. In this event, no active load is required at the collector of transistor TR. Hence, transistors TEI, TPI and diode DO are omitted from the circuit. In addition, because current requirements are roughly halved, resistor RCC is replaced by RCC' which has a value about double that of RCC, i.e., RCC' = 1.4 kilohms. In all other significant respects, the circuit in FIG. 2 is identical to that in FIG. 1.

Similarly, if only the in-phase, $v_{out}$, were desired, no active load would be required at the collectors of transistors T1, T2 and T3. In this event, transistors TEO, TPO and diode DO would be omitted from the circuit in FIG. 1 and resistor RCC replaced by RCC!

Although the preferred embodiments in FIGS. 1 and 2 use NPN transistors as the switch transistors and PNP transistors as the constant current sources, it will be understood that the conductivity types could be reversed, with appropriate changes in potential and signal polarity. Moreover, for the sake of clarity we have identified ICS, in the sense of positive current flow, as a current sink and transistors TPO and TPI as current sources. Obviously, we could interchange these terms. The important point, from the standpoint of clear description, is that the currents ICPO and ICS both tend to flow in the same direction between the first and second reference potential VCC and VEE.

Figure 3:
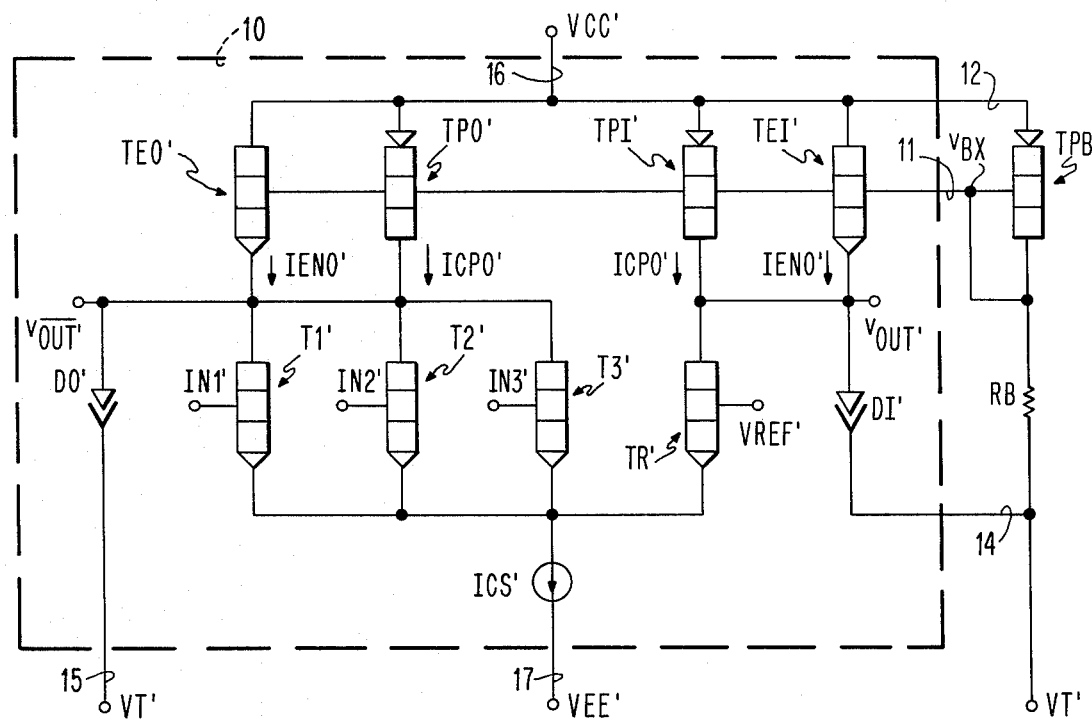
FIG. 3 is a circuit diagram of an alternate embodiment of our invention.

FIG. 3 is an embodiment of our invention which is quite similar to that of FIG. 1 except that it requires only a single resistor RB for a plurality of current switch circuits. Typically, resistor RB and diode TPB may serve four current switch circuits.

Because the circuit in FIG. 3 is quite similar to that in FIG. 1 in its basic components, the components in FIG. 3 which are similar to those in FIG. 1 are denoted by the prime of the same alpha-numerical designation. Thus, for example, transistor TEO in FIG. 1 is similar to transistor TEO' in FIG. 3, and so on. For this reason, the description which follows does not repeat in great detail the identification or the function of all of the elements in FIG. 3.

Transistors TEO' and TPO' are connected in parallel between VCC and the collectors of the input switch transistors. Similarly transistors TP1' and TE1' are connected in parallel between the VCC and the collector of transistor TR'.

As with the circuit in FIG. 1, the current generated from transistors TPO' and TPI', denoted ICPO', must be less than current ICS'. ICPO' is determined by output reference voltage $V_T'$, the $V_{BE}$ of transistor TPB and resistor RB by the following equation:

(2). ICPO' = [VCC'−$V_{BE}$(of TPB)−VT']/RB.

Transistor TPB, which is connected as a diode in the forward direction between VCC' and VT', thus provides a bias and constant current control for the transistors TPO' and TPI' as well as base drive for transistors TEI' and TEO'.

Operation of the Circuit in FIG. 3

With transistors T1', T2' and T3' off, TR' is rendered conductive. Because ICS' is greater than ICPO', transistor TEI' conducts to supply the current difference, IENO'. With TEI' conducting, the in-phase output $v_{out}'$ is then one $V_{BE}$ drop below vBX, typically −1.6 V. Simultaneously, the current ICPO' from transistor TPO' flows through schottky diode DO' which causes the out-of-phase output $v_{\overline{out}}'$ to rise one $V_f$ of diode DO' above the external VT', i.e., approximately −1.0 V up level.

When either T1',T2' or T3' or any combination thereof turn on, transistor TR turns off, resulting in the reverse output levels. $v_{\overline{out}}'$ falls to −1.6 V and $v_{out}'$ rises to −1.0 V.

As with the circuit in FIG. 1, the AC performance is dependent upon the Beta of the PNP transistor and the ICS' current level. For a Beta of 3, an ICS of 0.6 mA and an ICPO' of 0.4 mA, an average delay of 600 picoseconds is obtainable with a power dissipation of less than 3.0mW. This equates to a speed-power product of 1.8 picojoules.

Figure 4:
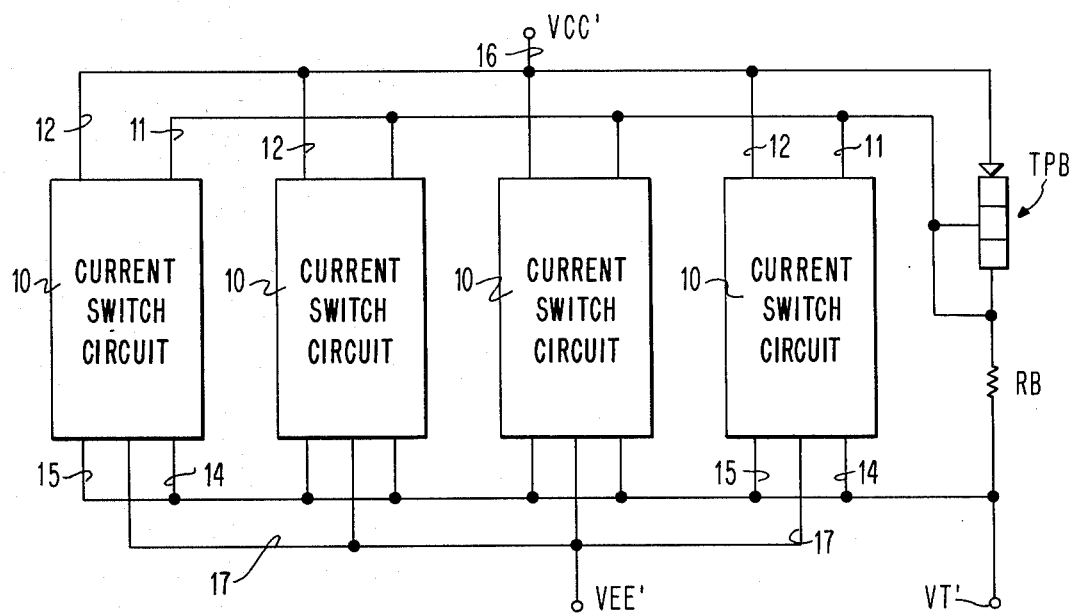
FIG. 4 illustrates a preferred connection of a plurality of circuits of the type shown in FIG. 3.

As previously mentioned, because resistor RB and transistor TPB are required only to set the level of current ICPO', they may also be used in other circuits. A block diagram configuration of such a circuit is shown in FIG. 4 where four current switch circuits are used in common with the same resistor RB and transistor TPB.

Reference potentials VCC', VEE' and VT' are supplied to each of the current switch circuits 10 via lines 16, 17 and 14 − 15, respectively. The same applies to VREF'.

Typically, each of the reference potentials is generated external to the semiconductor chip containing the current switch circuits and serve all such circuits on the chip.

The specific embodiments shown in the drawing above are merely illustrative of several of the forms which the invention may take in practice. Numerous modifications will readily occur to those skilled in the art without departing from the scope of the invention as delineated in the appended claims which are to be construed as broadly as permitted by the prior art.

We claim:

1. In a current switch circuit which includes:
   at least one input switch transistor and a reference switch transistor connected between first and second reference potentials;
   a first current source connected between the emitters of said switch transistors and said second reference potential;
   the base of said reference transistor connected to an input reference potential and the base of said at least one input transistor connected to a source of an input signal;
   the improvement comprising:
   a second current source connected between said first reference potential and the collector of either said reference switch transistor, or said at least one input switch transistor, the current from said second current source being less than the current in said first current source and tending to flow in the same direction between said reference potentials;
   means, connected between said first reference potential and the collector of the switch transistor to which said second current source is connected, for supplying supplementary current to said first current source when the switch transistor to which said second current source is connected is conductive; and
   means, connected to said second current source, for diverting said current from said second current source when the switch transistor to which said second current source is connected is non-conductive.

2. In a current switch circuit which includes:

at least one input switch transistor and a reference switch transistor connected between first and second reference potentials;

a first current source connected between the emitters of said switch transistors and said second reference potential;

the base of said reference transistor connected to an input reference potential and the base of said at least one input transistor connected to a source of an input signal, the improvement comprising:

second and third current sources connected between said first reference potential and the collectors of said input and reference switch transistors, respectively, the current from said second and third current sources being less than the current in said first current source and tending to flow in the same direction between said first and second reference potentials;

first and second means connected between said first reference potential and the collectors of said input reference switch transistors, respectively, for supplying supplementary current to said first current source when said respective switch transistors are conductive; and first and second means connected to said second and third current sources, respectively, for diverting the current from said second and third current source when said respective switch transistors are non-conductive.

3. In a current switch circuit which includes at least one input switch transistor and a reference switch transistor connected between a first reference potential and a current sink, the base of said reference transistor connected to an input reference potential and the base of said at least one input transistor connected to a source of an input signal, the improvement comprising:

a current source connected between said first reference potential and the collector of either said reference switch transistor or said at least on input switch transistor, the current from said current source being less than the current in said sink;

means, connected between said first reference potential and the collector of the switch transistor to which said current source is connected, for supplying supplementary current to said current sink when the switch transistor to which said current source is connected is conductive; and means, connected to said current source, for diverting said source current when said switch transistor to which said current source is connected is non-conductive.

4. A current switch circuit as in claim 3 wherein:

said current source includes a transistor of complementary conductivity type to said switch transistors;

said supplementary current means is a transistor of the same conductivity type as said switch transistors;

the collector of said current source transistor and the emitter of said supplementary current transistor being connected to the collector of the switch transistor to which said current source is connected;

the emitter of said current source transistor and the collector of said supplementary current transistor being connected to said first reference potential; and said current diverting means includes: a second reference potential; and impedance means connected between the collector of said current source and said second reference potential.

5. A current switch circuit as in claim 4 wherein:

the base of said supplementary current transistor is connected to the emitter of said current source transistor; and said current source further includes resistive means connected between the emitter of said current source transistor and said first reference potential.

6. A current switch circuit as in claim 5 wherein said impedance means comprises a Schottky Barrier diode.

7. A current switch circuit as in claim 4 wherein the bases of said supplementary current transistor and said current source transistor are connected and further comprising:

resistive means and asymmetric impedance means connected in series between said first and second reference potentials for controlling the magnitude of current from said current source.

8. A current switch circuit as in claim 7 wherein said asymmetric impedance means comprises a transistor of said complementary conductivity type with its base region connected to its collector region and to the base region of said current source transistor.

9. A current switch circuit as in claim 7 wherein said impedance means comprises a Schottky Barrier diode.

10. A current switch circuit as in claim 4 wherein said switch transistors are NPN type and said current source transistor is PNP type.

11. In a current switch circuit which includes at least one input switch transistor and a reference switch transistor connected between a first reference potential and a current sink, the base of said reference transistor connected to an input reference potential and the base of said at least one input transistor connected to a source of an input signal, the improvement comprising:

first and second current sources connected between said fist reference potential and the collectors of said input and reference switch transistors, respectively, the current from each of said current sources being less than the current in said sink;

first and second means connected between said first reference potential and the collectors of said input and reference switch transistors, respectively, for supplying supplementary current to said current sink when said respective switch transistors are conductive; and first and second means connected to said first and second current sources, respectively, for diverting the current from said sources when said respective switch transistors are non-conductive.

12. A current switch circuit as in claim 11 wherein:

said current sources include transistors of complementary conductivity type to said switch transistors;

said supplementary current means are transistors of the same conductivity type as said switch transistors; and the collectors of said first and second current source transistors and the emitters of said first and second supplementary current transistors being connected to the collector of said input and reference switch transistors, respectively;

the emitters of said current source transistors and the collectors of said supplementary current transistors being connected to said first reference potential;

said first and second current diverting means include:
a second reference potential; and
first and second impedance means connected between the collectors of said first and second current source transistors, respectively, and said second reference potential.

13. A current switch circuit as in claim 12 wherein said first and second impedance means comprise Schottky Barrier diodes.

14. A current switch circuit as in claim 12 wherein the bases of said first and second supplementary current transistors are connected to the emitters of said first and second current source transistors, respectively, and each said current source further includes:
resistive means connected between the emitters of said current source transistors and said first reference potential.

15. A current switch circuit as in claim 14 wherein said resistive means is a single resistor.

16. A current switch circuit as in claim 12 wherein:
the bases of said first and second supplementary current transistors are connected to the emitters of said first and second current source transistors, respectively, and said first and second current sources further include:
first and second resistive means connected between the emitters of said first and second current source transistors, respectively, and said first reference potential;
whereby said source currents may be independently selected.

17. A current switch circuit as in claim 16 wherein said first and second resistive means comprise first and second resistors, respectively.

18. A current switch circuit as in claim 12 wherein the bases of said first and second supplementary current transistors and said first and second current source transistors, respectively, are connected and further comprising:
third impedance means connected between said first and second reference potentials for controlling the magnitude of said source currents.

19. A current switch circuit as in claim 18 wherein said third impedance means comprises:
a series connection of a diode and a resistor.

20. A current switch circuit as in claim 19 wherein said diode is a transistor of said complementary conductivity type with its base region connected to its collector region and to the base regions of said current source transistors.

21. A current switch circuit as in claim 12 wherein said switch transistors are NPN type and said current source transistors are PNP type.

22. A plurality of current switch circuits having common reference potentials, each said current switch circuit comprising:
at least one input switch transistor and a reference switch transistor connected between a first reference potential and a current sink, the base of said reference transistor connected to an input reference potential and the base of said at least one input transistor connected to a source of an input signal;
a current source connected between said first reference potential and the collector of either said at least one input switch transistor or said reference switch transistor, the current from said current source being less than the current in said sink;
means, connected between said first reference potential and the collector of the switch transistor to which said current source is connected, for supplying supplementary current to said current sink when the switch transistor to which said current source is connected is conductive; and
means, connected to said current source, for diverting said source current to a second reference potential when the switch transistor to which said current source is connected is non-conductive;
said further comprising:
means connected to each of said current sources of each current switch for controlling the magnitude of current from said current sources.

23. A plurality of current switch circuits as in claim 22 wherein said current controlling means comprises:
resistive means and asymmetric impedance means connected in series between said first and second reference potentials.

24. A plurality of current switch circuits having common reference potentials, each said current switch circuit comprising:
at least one input switch transistor and a reference switch transistor connected between a first reference potential and a current sink, the base of said reference transistor connected to an input reference potential and the base of said at least one input transistor connected to a source of an input signal;
first and second current sources connected between said first reference potential and the collectors of said input and reference switch transistors, respectively, the current from each of said current sources being less than the current in said sink;
first and second means connected between said first reference potential and the collectors of said input and reference switch transistors, respectively, for supplying supplementary current to said current sink when said respective switch transistors are conductive; and
first and second means connected to said first and second current sources, respectively, for diverting the current from said source currents when said respective switch transistors are non-conductive.

25. A plurality of current switch circuits as in claim 24 wherein said current controlling means comprises:
resistive means and asymmetric impedance means connected in series between said first and second reference potentials.

* * * * *